(12) United States Patent
Huang et al.

(10) Patent No.: US 10,607,662 B2
(45) Date of Patent: Mar. 31, 2020

(54) STATIC RANDOM ACCESS MEMORY (SRAM) ARRAY POWER SUPPLY CIRCUIT

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Chen-Yi Huang, Shanghai (CN); Chia Chi Yang, Shanghai (CN); Dong Xiang Luo, Shanghai (CN); Cheng-Tai Huang, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 16/047,468

(22) Filed: Jul. 27, 2018

(65) Prior Publication Data
US 2019/0035435 A1 Jan. 31, 2019

(30) Foreign Application Priority Data

Jul. 27, 2017 (CN) .......................... 2017 1 0622991

(51) Int. Cl.
*G11C 5/14* (2006.01)
*G11C 11/419* (2006.01)
(Continued)

(52) U.S. Cl.
CPC .............. *G11C 5/147* (2013.01); *G11C 5/143* (2013.01); *G11C 7/04* (2013.01); *G11C 7/227* (2013.01);
(Continued)

(58) Field of Classification Search
None
See application file for complete search history.

(56) References Cited

U.S. PATENT DOCUMENTS 5,793,671 A * 8/1998 Selcuk .................. G11C 11/412
365/154
7,508,697 B1 * 3/2009 Mukhopadhyay ..... G11C 29/02
365/154

(Continued)

*Primary Examiner* — Douglas King
(74) *Attorney, Agent, or Firm* — Innovation Counsel LLP

(57) ABSTRACT

A Static Random Access Memory (SRAM) array power supply circuit is presented. The circuit comprises an SRAM test unit having a substantially same structure as a basic SRAM unit in the SRAM array; a switch device connected to a power source, the SRAM test unit, and the SRAM array; and a switch control circuit connected to the SRAM test unit and the switch device. When a test voltage in the SRAM test unit is lower than a threshold voltage, the switch device is closed so that the power source begins to charge the SRAM array and the SRAM test unit. The SRAM test unit provides an early warning for the SRAM array, allowing the latter to be charged upon fulfillment of a condition (e.g., charge is low). Compared to conventional circuits, this circuit provides an output voltage that is more stable and less susceptible to the changes in external conditions such as temperature or pressure.

20 Claims, 8 Drawing Sheets

(51) Int. Cl.
   *G11C 11/412* (2006.01)
   *G11C 7/04* (2006.01)
   *G11C 29/50* (2006.01)
   *G11C 7/22* (2006.01)
   *G11C 29/02* (2006.01)

(52) U.S. Cl.
   CPC .......... *G11C 11/412* (2013.01); *G11C 11/419* (2013.01); *G11C 29/021* (2013.01); *G11C 29/50* (2013.01)

(56) References Cited

U.S. PATENT DOCUMENTS

| | | | | |
|---|---|---|---|---|
| 7,978,503 B2* | 7/2011 | Koike | ................... | G11C 11/413 |
| | | | | 365/154 |
| 8,009,500 B2* | 8/2011 | Nii | ......................... | G11C 5/063 |
| | | | | 365/226 |
| 9,007,815 B2* | 4/2015 | Liaw | .................... | G11C 11/417 |
| | | | | 365/154 |
| 9,378,805 B2* | 6/2016 | Walsh | ................... | G11C 11/417 |
| 2019/0056915 A1* | 2/2019 | Jabir | ................. | G11C 13/0007 |

* cited by examiner

STATIC RANDOM ACCESS MEMORY (SRAM) ARRAY POWER SUPPLY CIRCUIT

CROSS-REFERENCE TO RELATED APPLICATION

This application claims priority to and benefit of Chinese Patent Application No. 201710622991.0 filed on Jul. 27, 2017, which is incorporated herein by reference in its entirety.

BACKGROUND

(a) Field of the Invention

This inventive concept relates to semiconductor technology and, more specifically to a Static Random Access Memory (SRAM) array power supply circuit.

(b) Description of the Related Art

An SRAM uses a small voltage (about 0.6V-0.9V) and a small current (in an order of uA) to maintain its data, and therefore is widely used for data storage. In wearable devices, a Low Drop Out (LDO) regulator is frequently used to power a SRAM. An LDO regulator itself, however, has an uA-level power consumption, thus is a significant power drain by the standard of a wearable device. Therefore a SRAM power supply with lower power consumption is desired.

One solution to this issue is to use several connected transistors to power a SRAM. Connected transistors have no DC path and therefore consume no DC power. However, its drawback is that its output voltage depends on the threshold voltage of each transistor and is difficult to control when multiple transistors are involved. For example, a 55 nm, 2.5 V transistor may have a threshold voltage $V_{th}$ in a range of 0.6 V to 0.75 V, thus when three such transistors are connected, the accumulated $V_{th}$ is in a range of 1.8 V to 2.25 V, with a large variation range of 0.45 V.

Conventionally, a capacitance may be used to stabilize the output voltage of a power supply. A capacitance, however, may affect the output current and change the output time, adversely affecting the output voltage.

SUMMARY

Based on the investigations on the limitations of conventional SRAM array power supply circuits, this inventive concept presents a power supply circuit that provides an output voltage that is more stable and less susceptible to changes in environmental elements such as temperature or pressure. The SRAM array power supply circuit comprises:

an SRAM test unit having a substantially same structure as a basic SRAM unit in the SRAM array;

a switch device connected to a power source, the SRAM test unit, and the SRAM array; and a switch control circuit connected to the SRAM test unit and the switch device, wherein when a test voltage in the SRAM test unit is lower than a threshold voltage, the switch device is closed so that the power source begins to charge the SRAM array and the SRAM test unit.

Additionally, in the aforementioned circuit, when a leakage voltage in the SRAM test unit is higher than the threshold voltage, the switch control circuit may open the switch device so that the power source no longer charges the SRAM array and the SRAM test unit.

Additionally, in the aforementioned circuit, a supply voltage to the SRAM test unit may be less than a supply voltage to the SRAM array, wherein the supply voltage to the SRAM test unit or the SRAM array is a voltage at a source of a P-type Metal-Oxide-Semiconductor (PMOS) transistor in a basic SRAM unit in the SRAM test unit or in a basic SRAM unit in the SRAM array.

Additionally, in the aforementioned circuit, at least one of the following three conditions may be true:

(a) the SRAM test unit is a basic SRAM unit in the SRAM array;

(b) the SRAM test unit is a backup basic SRAM unit of the SRAM array;

(c. the SRAM test unit and the SRAM array are in a same environmental temperature.

Additionally, in the aforementioned circuit, the power source may be connected to the SRAM test unit and the SRAM array, and provide a minimum current to the SRAM test unit and the SRAM array.

Additionally, the aforementioned circuit may further comprise a leakage acceleration circuit connected to the SRAM test unit and the switch control circuit, wherein the leakage acceleration circuit accelerates the current leakage in the SRAM test unit.

Additionally, in the aforementioned circuit, the leakage acceleration circuit may comprise Complementary Metal-Oxide-Semiconductor (CMOS) transistors.

Additionally, the aforementioned circuit may be a low-voltage linear regulator, the switch control circuit may be a buffer, and the switch device may be an electric delay, a PMOS transistor, or an NMOS transistor.

Additionally, in the aforementioned circuit, the switch device may comprise a first switch connected to the power source and the SRAM test unit, and a second switch connected to the SRAM array and the first switch.

The switch control circuit may be connected to the first switch and the second switch. When the test voltage of the SRAM test unit is less than the threshold voltage, the first switch and the second switch are closed, so that the power source begins to charge the SRAM array and the SRAM test unit.

Additionally, in the aforementioned circuit, at least one of the following two conditions may be true:

(a) the first switch is an electric relay, a PMOS transistor, or an NMOS transistor;

(b) the second switch is an electric relay, a PMOS transistor, or an NMOS transistor.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
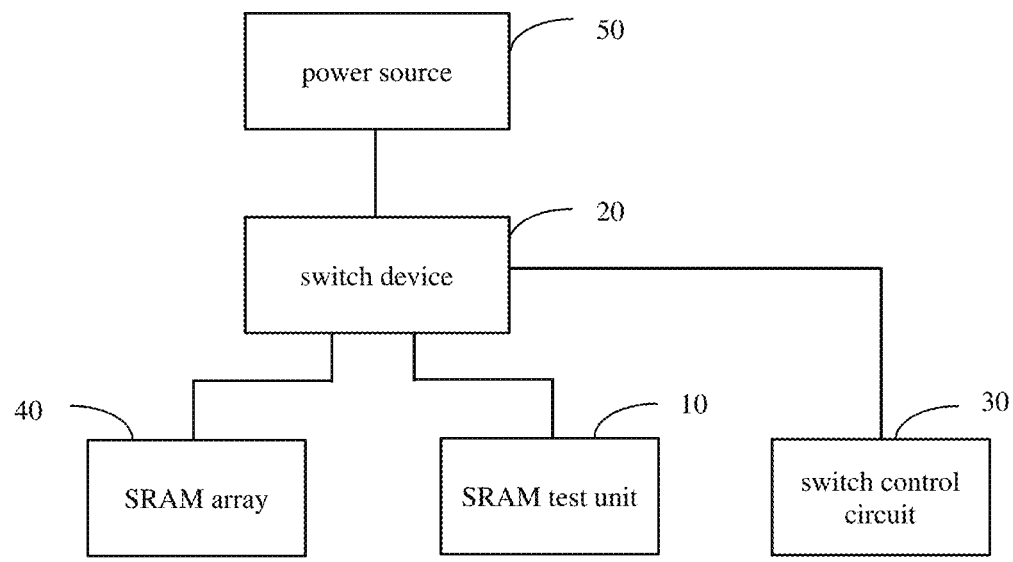
FIG. 1 shows a diagram illustrating a SRAM array power supply circuit in accordance with a first embodiment of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a diagram illustrating an SRAM array power supply circuit in accordance with a first embodiment of this inventive concept. Referring to FIG. 1, the power supply circuit may comprise a SRAM test unit (bit cell) 10, a switch device 20, and a switch control circuit 30.

In one embodiment, the SRAM test unit 10 may have a same structure with a basic SRAM unit in the SRAM array 40, or is itself a basic SRAM unit in the SRAM array 40, and the SRAM test unit 10 and the SRAM array 40 may be in a same environmental temperature.

Figure 2:
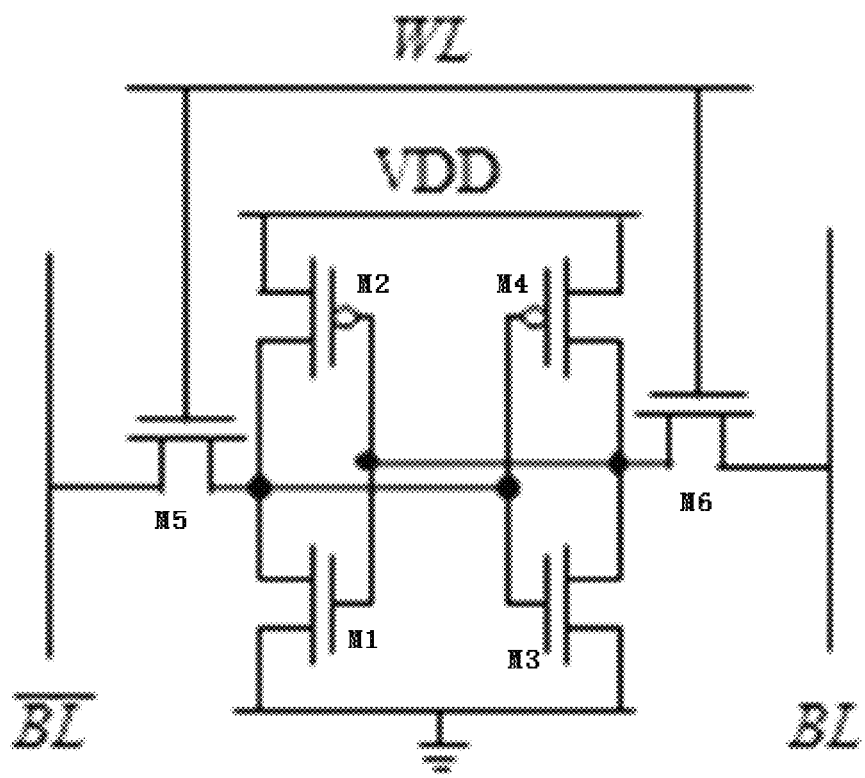
FIG. 2 shows a diagram illustrating the structure of a basic SRAM unit.

FIG. 2 shows a diagram illustrating the structure of a basic SRAM unit. Referring to FIG. 2, the basic SRAM unit may comprise six Field-Effect Transistors (FET): M1, M2, M3, M4, M5, and M6, four of them (M1, M2, M3, and M4) form two cross-coupled inverters, with the FETs M1 and M2 forming a first inverter, and the FETs M3 and M4 forming a second inverter, these four FETs storage one bit of the data. The other two FETs (M5 and M6) are switches for writing and reading the bit line of the basic SRAM unit.

In one embodiment, the SRAM test unit 10 may be a backup SRAM unit. In a typical IC manufacturing process, chips are manufactured in a square region in the center of a wafer, and excessive space on the boundary of the wafer may remain unused, thus one or more SRAM units (bit cell) may be manufactured there as backup units.

The switch device 20 may be connected to a power source 50, the SRAM test unit 10, and the SRAM array 40.

In one embodiment, the switch device 20 may be an electric delay, a P-type Metal-Oxide-Semiconductor (PMOS) transistor, or an N-type Metal-Oxide-Semiconductor (NMOS) transistor.

The switch control circuit 30 may be connected to the SRAM test unit 10 and the switch device 20.

In one embodiment, the switch control circuit 30 may be a buffer.

When a test voltage of the SRAM test unit 10 is less than a threshold voltage, the switch device 20, controlled by the switch control circuit 30, is closed so that the power source 50 begins to charge the SRAM array 40 and the SRAM test unit 10. The SRAM array 40 and the SRAM test unit 10 thus changes from a retention mode to a charging mode. Referring to FIG. 2, the test voltage on the SRAM test unit 10 is a voltage at an output node of the second inverter, that is, a voltage at drains of the transistors M3 or M4.

In one embodiment, when a leakage voltage of the SRAM test unit 10 is higher than the threshold voltage, the switch control circuit 30 may open the switch device 20, thus the SRAM array 40 and the SRAM test unit 10 are disconnected from the power source 50, and return to the retention mode.

In one embodiment, the power source 50 may be connected to the SRAM test unit 10 and the SRAM array 40 to provide a minimum current that to maintain the retention mode.

In one embodiment, the power source 50 may provide the SRAM test unit 10 a minimum current through a first current path, and provide the SRAM array 40 a minimum current through a second current path.

In another embodiment, the power source 50 may provide the SRAM test unit 10 and the SRAM array 40 a minimum current through a third current path.

The main purpose of the minimum current is for the SRAM test unit 10 and the SRAM array 40 to retain its data.

As electricity carriers gradually discharge over time, the voltage on a transistor gradually reduces. When the voltage drops below the threshold voltage ($V_t$) of a transistor, the transistor enters an unstable state and the data stored in the transistor is lost. Continuously charging the SRAM can maintain the voltage on the transistor but that will consume too much power. Entering the retention mode, which only requires a minimum voltage on the transistor to retain data, is an alternative that consumes much less power.

The SRAM array power supply circuit of this inventive concept monitors a leakage current in the SRAM array by measuring a leakage current in the SRAM test unit. When the SRAM array is about to enter an unstable state (and thus lose the data), the circuit, which detects the approaching status change through the leakage current in the SRAM test unit, closes the switch device so that the power source begins to charge the SRAM array. Compared to conventional circuits, the output voltage provided by this circuit is more stable, and less susceptible to the changes in external conditions such as temperature or pressure. Thus, it is an improvement over conventional LDO regulator circuits. In one embodiment, a supply voltage to the SRAM test unit 10 is less than a supply voltage to the SRAM array 40, wherein the supply voltage to the SRAM test unit 10 or the SRAM array 40 is the voltage on a source of a PMOS transistor in a basic SRAM unit in the SRAM test unit 10 or in a basic SRAM unit in the SRAM array 40. As a result, the SRAM test unit 10 has a faster current leakage than the SRAM array 40, that is, the leakage current in the SRAM test unit 10 is larger than that in the SRAM array 40, therefore the SRAM test unit 10 can provide an early warning for current leakage in the SRAM array 40.

For example, in one embodiment, the voltage applied to the SRAM test unit 10 may be SRAM_DVdd, and the voltage applied to the SRAM array may be Vdd. These two voltages may be configured so that the SRAM test unit 10 has a faster voltage drop than the SRAM array 40 under the same external conditions, thus the SRAM test unit 10 will enter an unstable state before the SRAM array 40 does. When the switch control circuit 30 detects such a status change in the SRAM test unit 10, it may close the switch device 20 so that the power source 50 begins to charge the SRAM array 40, which has not entered an unstable state due to its slower voltage drop.

Figure 3:
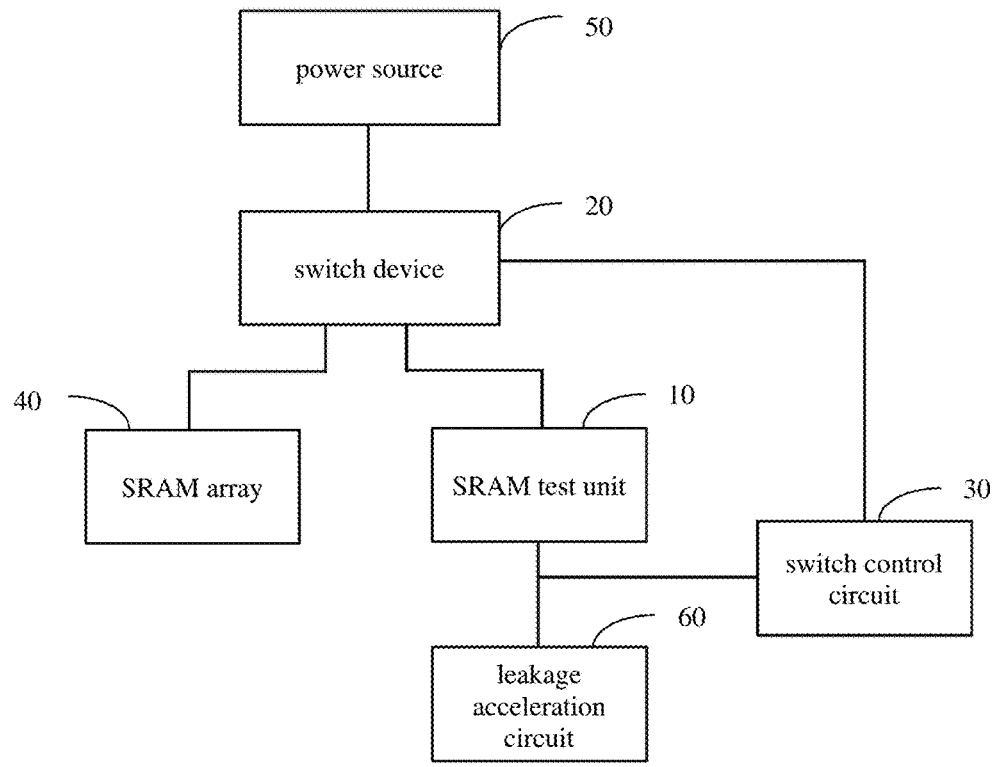
FIG. 3 shows a diagram illustrating a SRAM array power supply circuit in accordance with a second embodiment of this inventive concept.

FIG. 3 shows a diagram illustrating a SRAM array power supply circuit in accordance with a second embodiment of this inventive concept. Compared to the circuit in FIG. 1, the circuit in FIG. 3 further comprises a leakage acceleration circuit 60.

The leakage acceleration circuit 60 is connected to the SRAM test unit 10 and the switch control circuit 30, and accelerates the current leakage in the SRAM test unit 10. It ensures that the SRAM test unit 10, which works as an early warning unit for the SRAM array 40, will enter an unstable state earlier than the SRAM array 40.

In one embodiment, the leakage acceleration circuit 60 may comprise resistances or Complementary Metal-Oxide-Semiconductor (CMOS) transistors.

The magnitude of a SRAM array's leakage current is related to external conditions such as temperature and humidity, higher temperature typically leads to faster current leakage. By adding a leakage acceleration circuit 60, this inventive concept ensures that the SRAM test unit 10 has a faster current leakage than the SRAM array 40, and therefore can work as an early warning unit for the SRAM array 40, even if they are in different external conditions such as in different temperatures.

Additionally, the circuit in this inventive concept may adjust the time interval between the charges according to different manufacturing processes, voltage, or temperature, so that the current for maintaining the SRAM array in the retention mode is at a minimum. On the other hand, conventional circuits, not being able to adapt to changing conditions, must maintain a larger current in anticipation to the worst scenario, and therefore consumes more power.

In the circuit of this inventive concept, the SRAM test unit 10 provides an early warning for approaching status change of the SRAM array 40, it is an improvement over conventional circuits and provides an output voltage that is more robust to the changes in external conditions such as manufacturing process, voltage and temperature.

Additionally, unlike conventional circuits, the circuit in this inventive concept does not need to maintain a large constant current to retain its data. A large current is used only when the SRAM array is being charged, therefore it consumes less power than conventional circuits.

Figure 4:
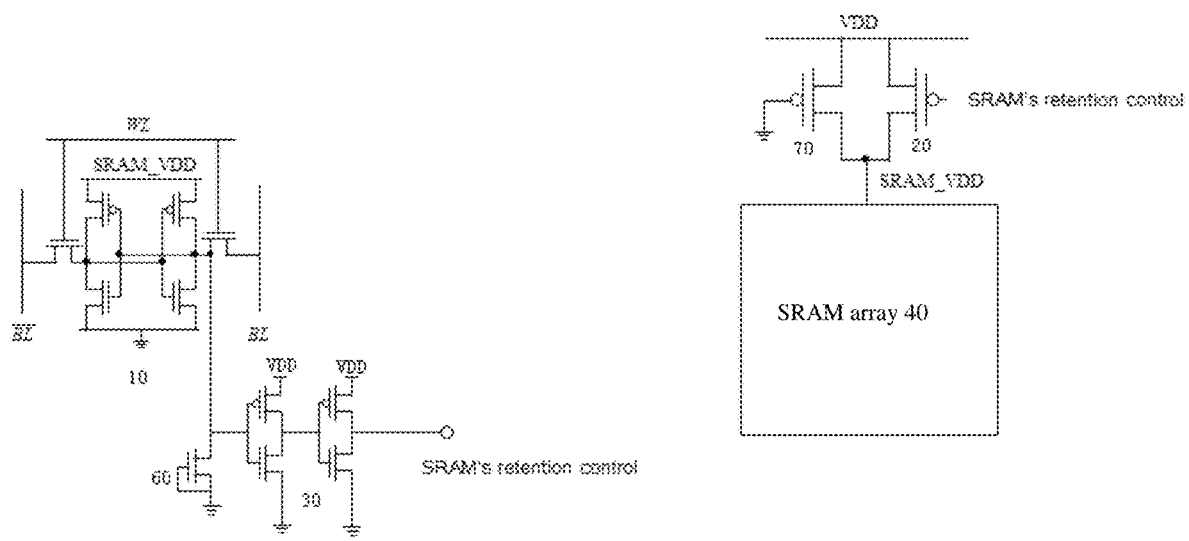
FIG. 4 shows a diagram illustrating a SRAM array power supply circuit in accordance with a third embodiment of this inventive concept.

FIG. 4 shows a diagram illustrating a SRAM array power supply circuit in accordance with a third embodiment of this inventive concept. Compared to the circuit in FIG. 3, the circuit in FIG. 4 further comprises a third switch 70.

The third switch 70 may be a PMOS transistor, with a source connected to a power source Vdd, a gate connected to the ground, and a drain connected to the SRAM array 40 and the SRAM test unit 10. The third switch 70 is always closed and forms a third minimum current path to provide a minimum current to keep the SRAM array 40 and the SRAM test unit 10 in the retention mode.

The switch device 20 may be a PMOS transistor, with a source connected to the power source Vdd, a gate connected to a retention control node (more specifically, an output node of the switch control circuit 30), and a drain connected to the SRAM array 40 and the SRAM test unit 10.

The switch device 20 works as a charge control switch for the SRAM array 40 and the SRAM test unit 10. When the switch device 20 is closed, the power source charges the SRAM array 40 and the SRAM test unit 10. When the switch device 20 is open, the SRAM array 40 and the SRAM test unit 10 are not charged and remain in the retention mode, the power source only provides, through the third switch 70, a minimum current to the SRAM array 40 and the SRAM test unit 10.

In the circuit in FIG. 4, the leakage acceleration circuit 60 may be a CMOS transistor with a gate and a source connected to the ground. The leakage acceleration circuit 60 ensures that the SRAM test unit 10 has a faster current leakage than the SRAM array 40, and therefore may work as an early warning unit for the SRAM array 40.

In the circuit in FIG. 4, the switch control circuit may be a buffer. Referring to FIG. 4, the buffer may comprise two serially-connected CMOS inverters. One of these two CMOS inverters may comprise a PMOS transistor whose source is connected to a high voltage (e.g., Vdd) and an NMOS transistor whose source is connected to a low voltage (e.g., ground). The gates of these two transistors are connected together at an input node of this CMOS inverter, and the drains of these two transistors are connected together at an output node of this CMOS inverter. When an input voltage to the CMOS inverter is a low voltage (e.g., ground), the PMOS transistor is in a conducting state, the NMOS transistor is in a cutoff state, thus the output voltage is a high voltage (e.g, Vdd); when an input voltage to the CMOS inverter is a high voltage (e.g., Vdd), the NMOS transistor is in a conducting state, the PMOS transistor is in a cutoff state, thus the output voltage is a low voltage (e.g., ground).

In the circuit of FIG. 4, when the SRAM test unit 10 is in the retention mode, a test voltage (i.e., the input voltage of the buffer) will gradually decrease due to the current leakage. When the test voltage drops below a threshold voltage, the output voltage of the buffer is a low voltage, thus the switch device 20 is closed and the power source begins to charge the SRAM array 40 and the SRAM test unit 10. When the test voltage becomes higher than the threshold voltage, the output voltage of the buffer becomes a high voltage, thus the switch device 20 is open, the SRAM array 40 and the SRAM test unit 10 are not charged and remain in the retention mode, the power source only provides, through the third switch 70, a minimum current to the SRAM array 40 and the SRAM test unit 10.

In this inventive concept, an SRAM test unit 10 provides an early warning to the voltage drop in the SRAM array 40, and allows the latter to be timely charged before its voltage drops below the threshold voltage. Thus, it is an improvement over conventional circuits and its output voltage is less susceptible to the changes in external conditions such as manufacturing process, voltage, and temperature.

Additionally, unlike conventional circuits, the circuit in this inventive concept does not need to maintain a large constant current to retain data. A large current is used only when the SRAM array is charged. Therefore, overall power consumption is lower than that of conventional circuits.

Figure 5:
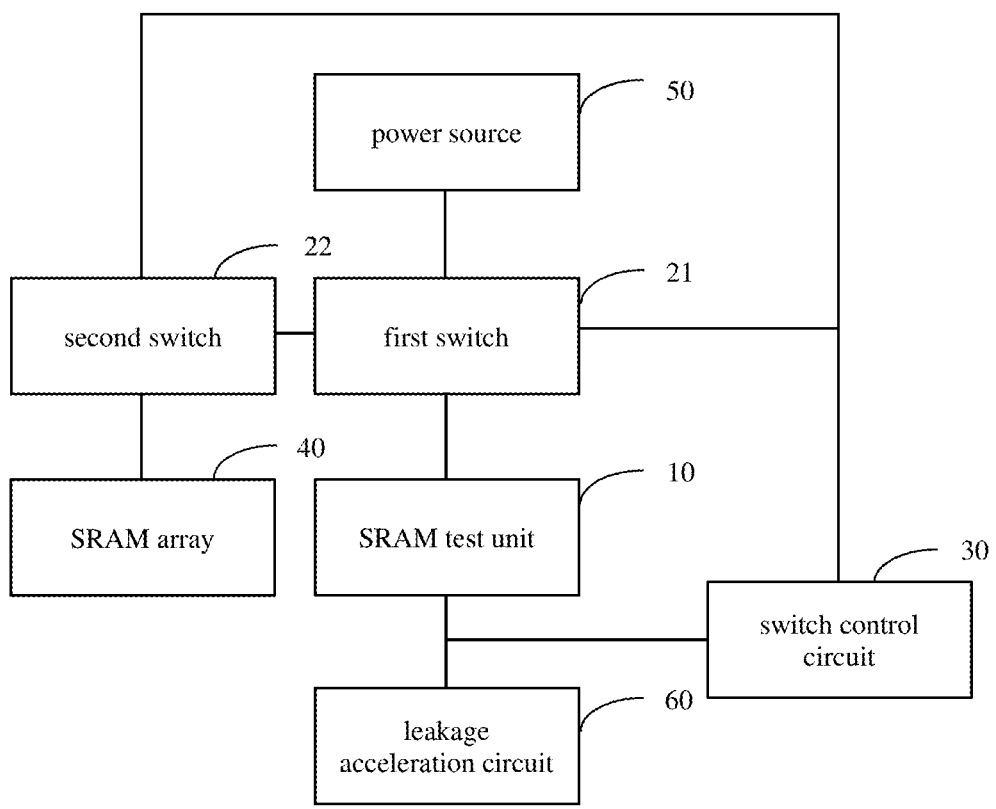
FIG. 5 shows a diagram illustrating a SRAM array power supply circuit in accordance with a fourth embodiment of this inventive concept.

FIG. 5 shows a diagram illustrating a SRAM array power supply circuit in accordance with a fourth embodiment of this inventive concept. Compared to the circuit in FIG. 3, the circuit in FIG. 5 further comprises a first switch 21 and a second switch 22. The first switch 21 is connected to the power source 50 and the SRAM test unit 10, and controls the charge of the SRAM test unit 10. When the first switch 21 is closed, the power source 50 charges the SRAM test unit 10; when the first switch 21 is open, the SRAM test unit 10 is not charged and remains in the retention mode.

In one embodiment, the first switch 21 may be an electric relay, a PMOS transistor, or an NMOS transistor.

The second switch 22 is connected to the SRAM array 40 and the first switch 21, and, together with the first switch 21, controls the charge of the SRAM array 40. When the first switch 21 and the second switch 22 are both closed, the power source 50 charges the SRAM array 40; when one of the first switch 21 and the second switch 22 is open, the SRAM array 40 is not charged and remains in the retention mode.

In one embodiment, the second switch 22 may be an electric relay, a PMOS transistor, or an NMOS transistor.

Figure 6:
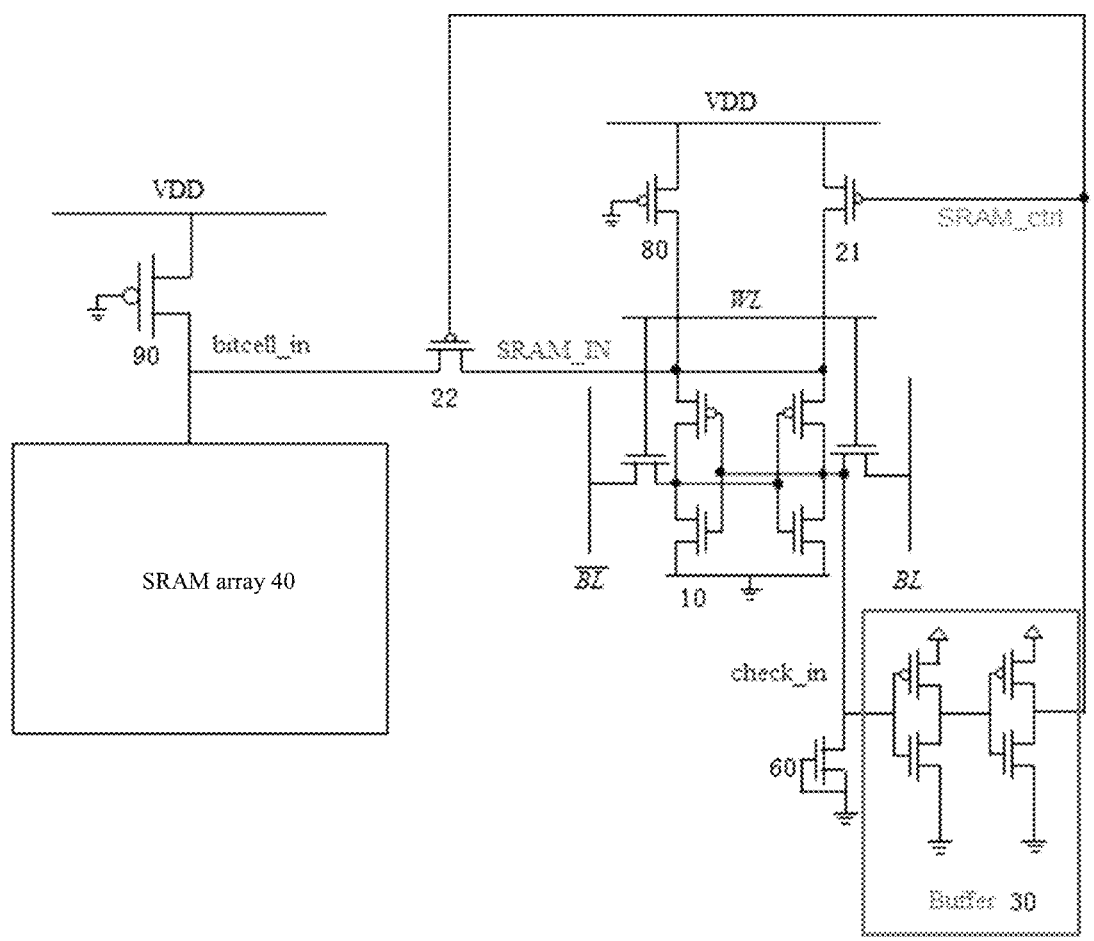
FIG. 6 shows a diagram illustrating a SRAM array power supply circuit in accordance with a fifth embodiment of this inventive concept.

FIG. 6 shows a diagram illustrating a SRAM array power supply circuit in accordance with a fifth embodiment of this inventive concept. The circuit in FIG. 6 is one possible implementation of the circuit in FIG. 5. Compared to the circuit in FIG. 5, the circuit in FIG. 6 may further comprise a fourth switch 80 and a fifth switch 90.

The fourth switch 80 may be a PMOS transistor, with a source connected to the power source Vdd, a gate connected to the ground, and a drain connected to the SRAM array 40. The fourth switch 80 is always closed, forming a second minimum current path through which a minimum current is provided to the SRAM array 40 to maintain the retention mode.

The fifth switch 90 may be a PMOS transistor, with a source connected to the power source Vdd, a gate connected to the ground, and a drain connected to the SRAM test unit 10. The fifth switch 90 is always closed, forming a first minimum current path through which a minimum current is provided to the SRAM test unit 10 to maintain the retention mode.

Referring to FIG. 6, the first switch 21 may be a PMOS transistor, with a source connected to the power source Vdd, a gate connected to the retention control node (more specifically, an output node of the switch control circuit 30), and a drain connected to the SRAM test unit 10 and the drain of the fifth switch 90.

The first switch 21 controls the charge of the SRAM test unit 10. When the first switch 21 is closed, the power source charges the SRAM test unit 10; when the first switch 21 is open, the SRAM test unit 10 is not charged and remains in the retention mode.

Referring to FIG. 6, the second switch 22 may be a PMOS transistor, with a source connected to the drain of the first switch 21, a gate connected to a retention control node (more specifically, an output node of the switch control circuit 30), and a drain connected to the drain of the fourth switch 80.

The second switch 22, together with the first switch 21, controls the charge of the SRAM array 40. When the first switch 21 and the second switch 22 are both closed, the power source charges the SRAM array 40; when one of the first switch 21 and the second switch 22 is open, the SRAM array 40 is not charged and remains in the retention mode.

The SRAM test unit 10 in FIG. 6 may be the same as the basic SRAM unit in FIG. 2, the buffer 30 in FIG. 6 may be the same as the buffer in FIG. 4. Therefore these structures are not repeatedly described here.

In one embodiment, when the SRAM test unit 10 is in the retention mode, the test voltage (i.e., the input voltage to the buffer 30) will gradually decrease due to the current leakage. When the test voltage drops below a threshold voltage, the output voltage of the buffer 30 becomes a low voltage, the first switch 21 and the second switch 22 are closed, and the power source begins to charge the SRAM array 40 and the SRAM test unit 10.

After charging for a sufficiently long period of time, the test voltage becomes higher than the threshold voltage, then the output voltage of the buffer 30 becomes a high voltage, the first switch 21 and the second switch 22 are open, and the SRAM 40 and the SRAM test unit 10 are not charged and are in the retention mode. At this time, the power source only provides, through the fourth switch 80 and the fifth switch 90, a minimum current to the SRAM array 40 and the SRAM test unit 10.

As described above, the power supply circuits in accordance with this inventive concept provides a more stable voltage output compared to conventional power supply circuits. In this inventive concept, a SRAM test unit 10 provides an early warning to the voltage drop in the SRAM array 40, and allows the latter to be timely charged before its voltage drops below the threshold voltage. Thus, it is an improvement over conventional circuits and provides an output voltage that is less susceptible to the changes in external conditions such as manufacturing process, voltage, and temperature.

Additionally, unlike conventional circuits, the circuit in this inventive concept does not need to maintain a large constant current to retain data. Due to the fact that a large current is used only when the SRAM array is charged, overall power consumption for the circuit disclosed herein is lower than that of conventional circuits.

Figure 7:
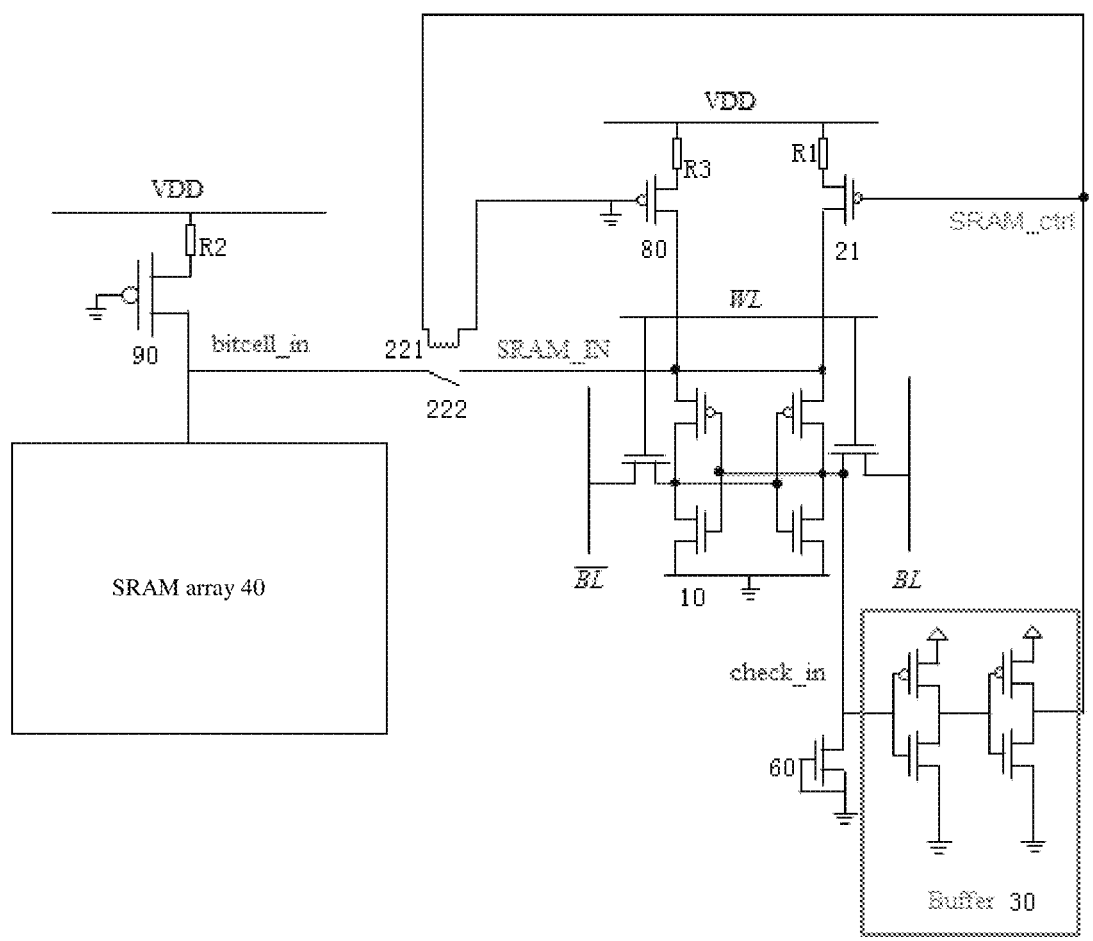
FIG. 7 shows a diagram illustrating a SRAM array power supply circuit in accordance with a sixth embodiment of this inventive concept.

FIG. 7 shows a diagram illustrating an SRAM array power supply circuit in accordance with a sixth embodiment of this inventive concept. The circuit in FIG. 7 is another possible implementation of the circuit in FIG. 5. Compared to the circuit in FIG. 6, the second switch 22 in the circuit in FIG. 7 is an electric replay that comprises a relay coil 221 and a relay contact 222. A first end of the relay coil 221 is connected to the retention control node (more specifically, the output node of the switch control circuit 30), a second end of the relay coil 221 is connected to the ground. A first end of the relay contact 222 is connected to the drain of the fourth switch 80, and a second end of the relay contact 222 is connected to the drain of the fifth switch 90.

In one embodiment, when the SRAM test unit 10 is in the retention mode, a test voltage (i.e., the input voltage of the buffer) will gradually decrease due to the current leakage. When the test voltage drops below a threshold voltage, the output voltage of the buffer becomes a low voltage, the first switch 21 is closed, and the power source begins to charge the SRAM test unit 10. Due to the current going through the relay coil 221, the relay contact 222 is closed, and the power source also begins to charge the SRAM array 40.

After charging for a sufficiently long period of time, the test voltage becomes higher than the threshold voltage, and the output voltage of the buffer becomes a high voltage, then the first switch 21 and the second switch 22 are open, and the SRAM array 40 and the SRAM test unit 10 are not charged and are in the retention mode. At this time, the power source only provides, through the fourth switch 80 and the fifth switch 90, a minimum current to the SRAM array 40 and the SRAM test unit 10.

Referring to FIG. 7, the power supply circuit may further comprise a first resistance R1, a second resistance R2, and a third resistance R3. The first resistance R1 is connected to the power source 50 and the first switch 21, the second resistance R2 is connected to the power source 50 and the fourth switch 80, and the third resistance R3 is connected to the power source 50 and the fifth switch 90.

In one embodiment, the first resistance R1, the second resistance R2, and the third resistance R3 may have different resistance values, so that the supply voltage on the SRAM test unit 10 is less than the supply voltage on the SRAM array 40.

Optimally, the first resistance R1 may be less than the second resistance R2, and the second resistance R2 may be less than the third resistance R3. More specifically, in one embodiment, the first resistance R1 may be 10.484 KΩ, the second resistance R2 may be 484 MΩ, and the third resistance R3 may be 484 GΩ.

In the embodiments described above, the supply voltage on the SRAM test unit 10 is less than the supply voltage on the SRAM array 40, thus the SRAM test unit 10 has a faster current leakage and a higher leakage current than the SRAM array 40, therefore the SRAM test unit 10 may work as an early warning unit for the current leakage in the SRAM array 40.

In this inventive concept, an SRAM test unit 10 provides an early warning to the voltage drop in the SRAM array 40, and allows the latter to be timely charged before its voltage drop below the threshold voltage. Thus, it is an improvement over conventional circuits and provides an output voltage that is less susceptible to the changes in external conditions such as manufacturing process, voltage, and temperature.

Additionally, unlike conventional circuits, the circuit in this inventive concept does not need to maintain a large constant current. A large current is used only when the SRAM array is charged, and therefore it consumes less power than conventional circuits.

The comparison between the power consumption of an SRAM array power supply circuit in this inventive concept and that of conventional circuits at different temperatures are presented below.

Figure 8:
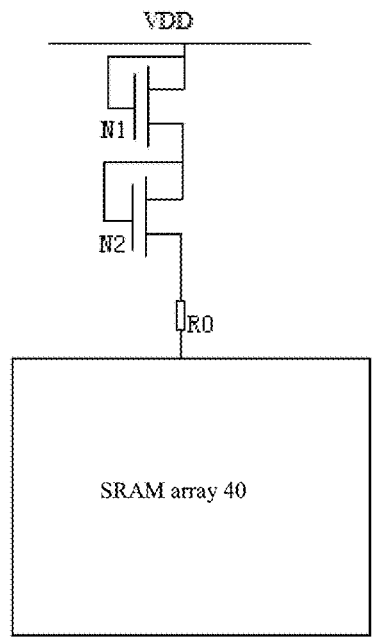
FIG. 8 shows a diagram illustrating the structure of a conventional Low Drop Out (LDO) regulator circuit.

FIG. 8 shows a diagram illustrating the structure of a conventional LDO regulator circuit. Referring to FIG. 8, the conventional LDO regulator circuit may comprise a first NMOS transistor N1, a second NMOS transistor N2, and a resistance R0. A gate and a drain of the first NMOS transistor N1 may be connected to a power source Vdd, a source of the first NMOS transistor N1 may be connected to a gate and a drain of the second NMOS transistor N2, a source of the second NMOS transistor N2 may be connected to a first end of the resistance R0, and a second end of the resistance R0 may be connected to the SRAM array 40.

Figure 9:
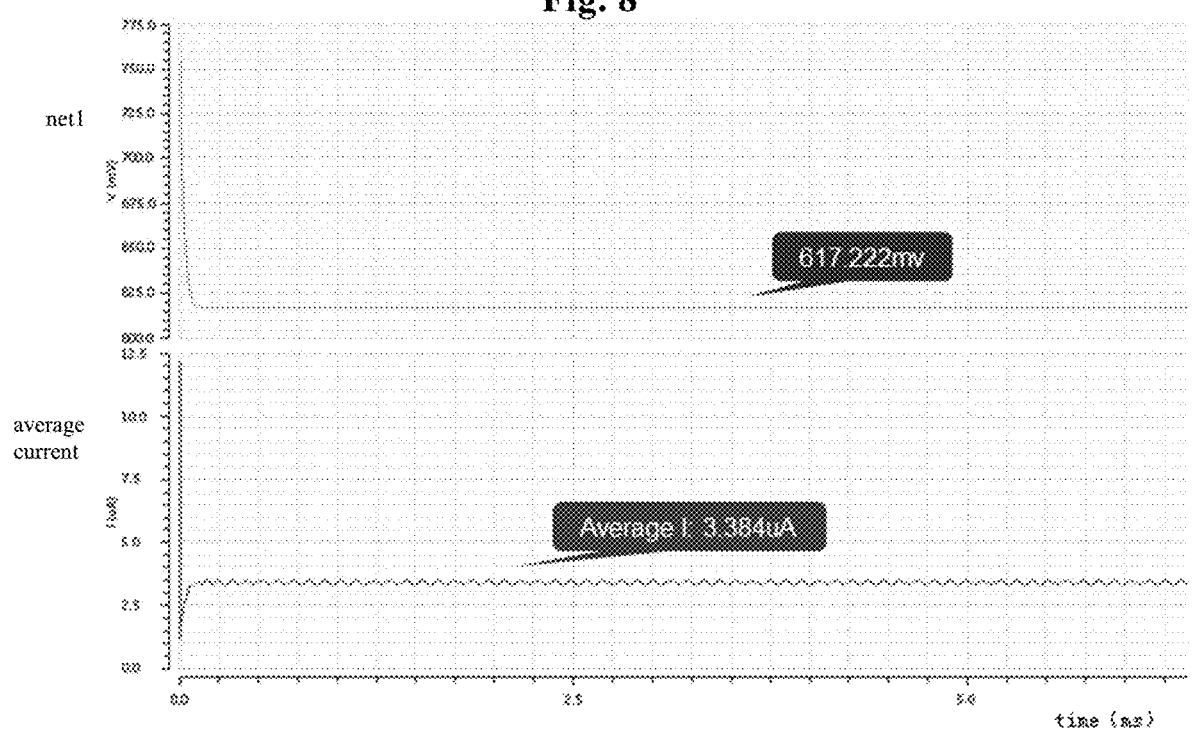
FIG. 9 shows a diagram illustrating the voltage or current at various locations in the circuit of FIG. 8 at 125° C.
Figure 10:
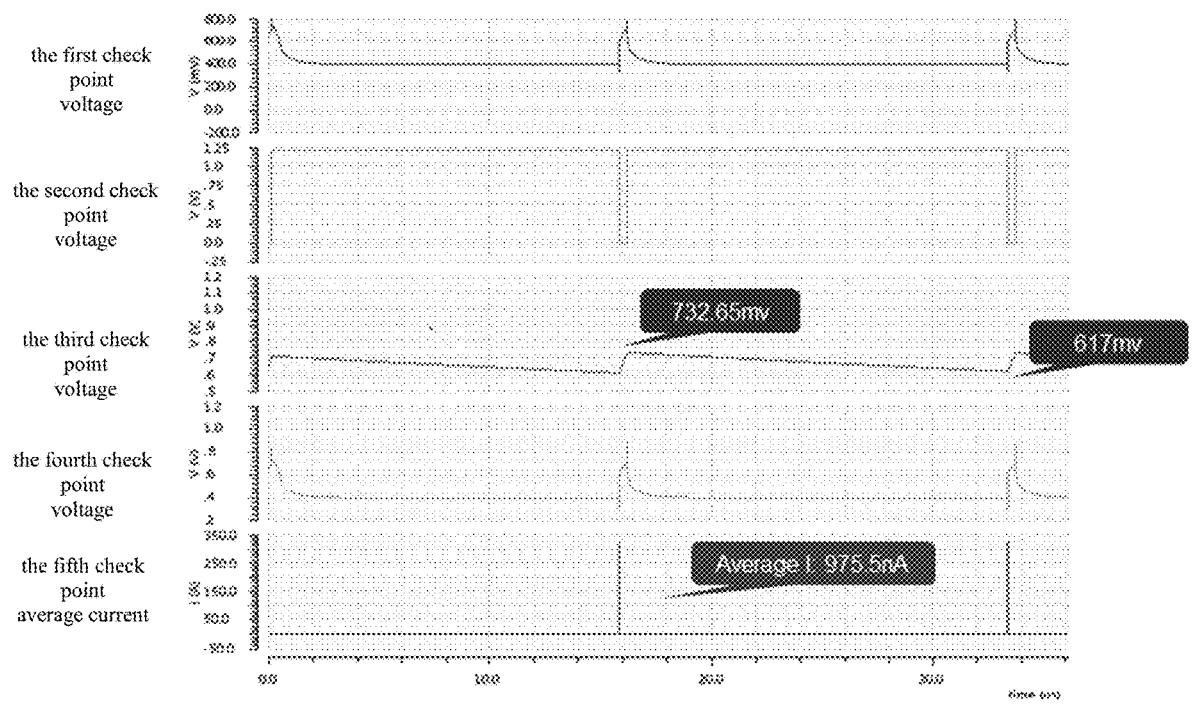
FIG. 10 shows a diagram illustrating the voltage or current at various locations in the circuit of FIG. 7 at 125° C.
Figure 11:
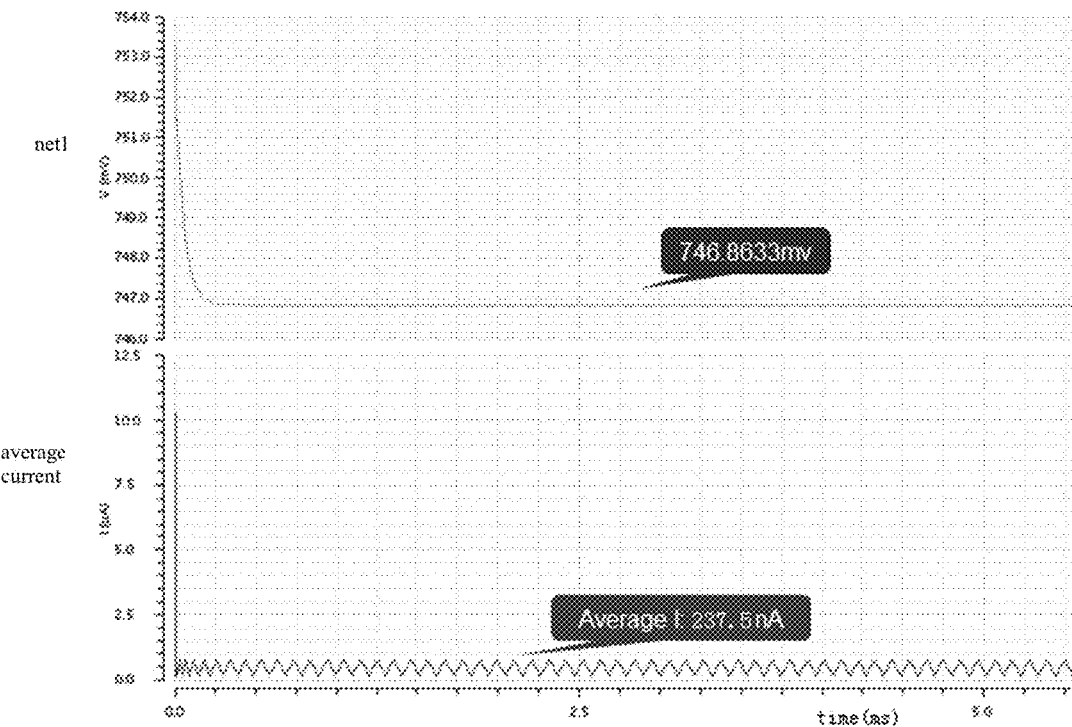
FIG. 11 shows a diagram illustrating the voltage or current at various locations in the circuit of FIG. 8 at 27° C.
Figure 12:
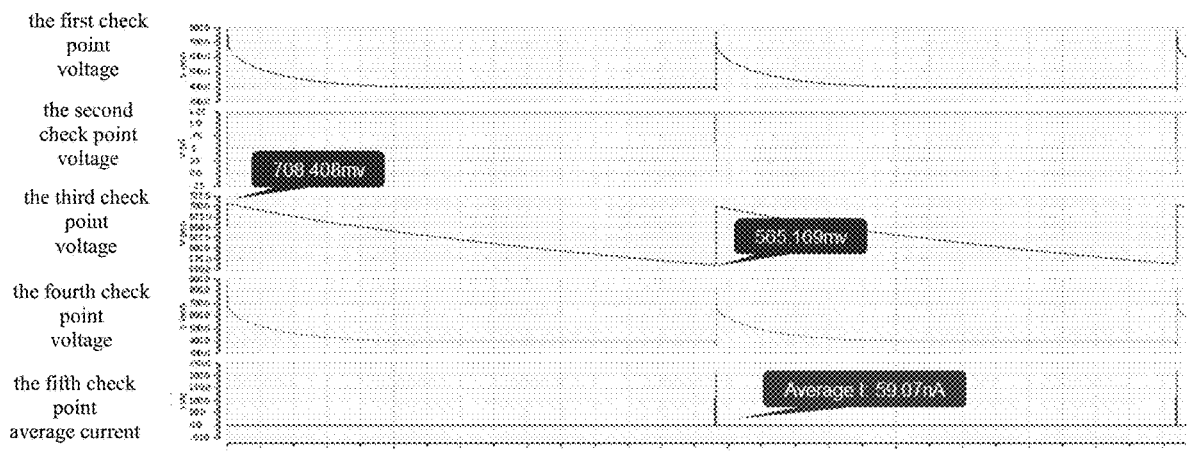
FIG. 12 shows a diagram illustrating the voltage or current at various locations in the circuit of FIG. 7 at 27° C.

FIG. 9 shows a diagram illustrating the voltage or current at various locations in the circuit of FIG. 8 at 125° C., FIG. 10 shows a diagram illustrating the voltage or current at various locations in the circuit of FIG. 7 at 125° C., FIG. 11 shows a diagram illustrating the voltage or current at various locations in the circuit of FIG. 8 at 27° C., and FIG. 12 shows a diagram illustrating the voltage or current at various locations in the circuit of FIG. 7 at 27° C.

In FIGS. 9 and 11, the y-axis "net1" represents the voltage on the LDO regulator circuit, that is, the voltage at the second end of resistance R0 in FIG. 8, and the y-axis "average current" represents the average current going through resistance R0 in FIG. 8.

In FIGS. 10 and 12, the first check point voltage is the voltage at the output node of the second inverter in the SRAM test unit 10 ("check_in" in FIG. 7), that is, the voltage at the drains of the transistors M3 and M4, as shown in FIG. 2, the second check point voltage is the voltage at the output node of the buffer in FIG. 7 ("SRAM_ctrl" in FIG. 7), that is, the voltage at the gates of the first switch 21 and the second switch 22, the third check point voltage is the voltage at the drain of the fourth switch 80 ("bitcell_in" in FIG. 7), the fourth check point voltage is the voltage at the source of the second switch 22 ("SRAM_in" in FIG. 7), the fifth check point average current is the average current going through the source of the fifth switch 90, which is also the average current going through the SRAM array 40.

The comparison results show that, since the conventional LDO regulator circuit does not comprise any early warning unit, the SRAM array is continuously charged and therefore, as shown in FIGS. 9 and 11, maintain a relatively large constant current.

On the other hand, the power supply circuit of this inventive concept comprises an early warning unit, thus the SRAM array is charged only when triggered by the early warning unit (e.g., when the test voltage is less than 0.4 V). Therefore, as shown in FIGS. 10 and 12, the average current in going through the SRAM array in the circuit of this inventive concept has a periodical impulse pattern and is much less than its counterpart in the conventional LDO circuit.

TABLE 1

| temperature | current in conventional LDO circuits | current in this power supply circuit | power consumption reduced by: |
|---|---|---|---|
| 27° C. | 237.5 uA | 59 uA | 75.16% |
| 125° C. | 3.384 uA | 0.975 uA | 71.19% |

Table. 1 shows the comparison results of the average current in the power supply circuit in this inventive concept with that in the conventional circuit at different temperatures. As shown in Table. 1, the average current in this power supply circuit is much less than that in the conventional circuit, indicating that this power supply circuit consumes much less power than the conventional circuit.

This concludes the description of a SRAM array power supply circuit in accordance with one or more embodiments of this inventive concept. For the purpose of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A power supply circuit for a Static Random Access Memory (SRAM) array, the power supply circuit comprising:
   an SRAM test unit having a substantially same structure as a basic SRAM unit in the SRAM array;
   a switch device connected to a power source, the SRAM test unit, and the SRAM array, wherein each of the SRAM test unit and the SRAM array is connected through the switch device to the power source; and
   a switch control circuit connected to the SRAM test unit and the switch device and configured to, when a test voltage in the SRAM test unit is lower than a threshold voltage, close the switch device so that the power source begins to charge at least one of the SRAM array and the SRAM test unit through the switch device, wherein the SRAM array is configured be in a stable state when the SRAM test unit is in an unstable state.

2. The circuit of claim 1, wherein when a leakage voltage in the SRAM test unit is higher than the threshold voltage, the switch control circuit opens the switch device so that the power source no longer charges the SRAM array and the SRAM test unit.

3. The circuit of claim 1, wherein a supply voltage from the power source to the SRAM test unit is less than a supply voltage from the power source to the SRAM array, wherein the supply voltage to the SRAM test unit or the SRAM array is a voltage at a source of a P-type Metal-Oxide-Semiconductor (PMOS) transistor in a basic SRAM unit in the SRAM test unit or in a basic SRAM unit in the SRAM array.

4. The circuit of claim 1, wherein at least one of the following three conditions is true:
   (a) the SRAM test unit is a basic SRAM unit in the SRAM array;
   (b) the SRAM test unit is a backup basic SRAM unit of the SRAM array;
   (c) the SRAM test unit and the SRAM array are in a same environmental temperature.

5. A power supply circuit for a Static Random Access Memory (SRAM) array, the power supply circuit comprising:

an SRAM test unit having a substantially same structure as a basic SRAM unit in the SRAM array;

a switch device connected to a power source, the SRAM test unit, and the SRAM array, wherein each of the SRAM test unit and the SRAM array is connected through the switch device to the power source; and a switch control circuit connected to the SRAM test unit and the switch device and configured to, when a test voltage in the SRAM test unit is lower than a threshold voltage, close the switch device so that the power source begins to charge at least one of the SRAM array and the SRAM test unit through the switch device; and a closed switch, wherein the power source is connected to the SRAM test unit and the SRAM array and is configured to provide a current to the SRAM test unit and the SRAM array through the closed switch when the switch device is open.

6. The circuit of claim 1, further comprising:
a leakage circuit connected to the SRAM test unit and the switch control circuit, wherein the leakage circuit is configured to leak current from the SRAM test unit.

7. The circuit of claim 6, wherein the leakage circuit comprises Complementary Metal-Oxide-Semiconductor (CMOS) transistors.

8. The circuit of claim 1, wherein the switch control circuit is a buffer.

9. The circuit of claim 1, further comprising: a transistor electrically connected to an output node of an inverter of the SRAM test unit, wherein a gate of the transistor is electrically grounded.

10. The circuit of claim 1, wherein the switch device is an electric relay, a PMOS transistor, or an NMOS transistor.

11. The circuit of claim 1, wherein the switch device comprises a first switch connected to the power source and the SRAM test unit, and a second switch connected to the SRAM array and the first switch, wherein the switch control circuit is connected to the first switch and the second switch and is configured to, when the test voltage of the SRAM test unit is less than the threshold voltage, close the first switch and the second switch so that the power source begins to charge the SRAM array and the SRAM test unit.

12. The circuit of claim 11, wherein at least one of the following two conditions is true:
(a) the first switch is an electric relay, a PMOS transistor, or an NMOS transistor;
(b) the second switch is an electric relay, a PMOS transistor, or an NMOS transistor.

13. The circuit of claim 1, wherein the switch control circuit comprises a first inverter and a second inverter that are serially connected.

14. The circuit of claim 13, wherein an input node of the first inverter is electrically connected to the SRAM test unit and is configured to receive the test voltage.

15. The circuit of claim 13, wherein the first inverter comprises a PMOS transistor, and wherein a source of the PMOS transistor is electrically connected to the power source.

16. The circuit of claim 13, wherein the first inverter comprises an NMOS transistor, and wherein a source of the NMOS transistor is electrically grounded.

17. The circuit of claim 13, further comprising: a transistor, wherein a drain of the transistor is electrically connected to each of an output node of an inverter of the SRAM test circuit and an input node of the first inverter of the switch control circuit.

18. The circuit of claim 13, wherein the first inverter and a second inverter are serially connected between an output node of an inverter of the SRAM test unit and a gate of the switch device.

19. The circuit of claim 13, wherein the first inverter is connected through the second inverter to a gate of the switch device.

20. The circuit of claim 1, further comprising:
a first current path electrically connected between the switch device and the SRAM test unit, directly connected to a first terminal of the switch device, and directly connected to the SRAM test unit; and a second current path electrically connected between the switch device and the SRAM array, directly connected to a second terminal of the switch device, directly connected to the SRAM array, and electrically insulated from the first current path.

* * * * *